United States Patent [19]

Yagyuu et al.

[11] Patent Number: 4,725,744
[45] Date of Patent: Feb. 16, 1988

[54] INPUT BUFFER CIRCUIT AND LOGIC CIRCUIT USING THE BUFFER CIRCUIT

[75] Inventors: Masayoshi Yagyuu, Kokubunji; Hiroyuki Itoh, Kodaira; Akira Masaki, Tokyo, all of Japan

[73] Assignee: Hitachi, Ltd., Tokyo, Japan

[21] Appl. No.: 736,260

[22] Filed: May 21, 1985

[30] Foreign Application Priority Data

May 23, 1984 [JP] Japan ................................ 59-102538

[51] Int. Cl.$^4$ ......................................... H03K 19/086
[52] U.S. Cl. ................................... 307/455; 307/467; 307/299.2
[58] Field of Search .................. 307/455, 467, 299 A, 307/297

[56] References Cited

U.S. PATENT DOCUMENTS 3,719,830  3/1973  Ananiades ........................... 307/455
3,921,007  11/1975  Lacher ............................. 307/299 A
4,329,597  4/1982  Yamagiwa ........................... 307/455

FOREIGN PATENT DOCUMENTS 1918873  10/1970  Fed. Rep. of Germany.

Primary Examiner—Stanley D. Miller
Assistant Examiner—B. P. Davis
Attorney, Agent, or Firm—Antonelli, Terry & Wands

[57] ABSTRACT

A logic circuit including an input transistor receiving the input signal at its emitter, an output transistor in emitter-follower configuration receiving the signal from the collector of the input transistor, a voltage dividing resistor pair connected to the collector of the input transistor, and a feedback circuit conducting the signal produced by the voltage dividing resistor pair back to the base of the input transistor, the output signal being produced at the emitter of the output transistor.

14 Claims, 9 Drawing Figures

INPUT BUFFER CIRCUIT AND LOGIC CIRCUIT USING THE BUFFER CIRCUIT

BACKGROUND OF THE INVENTION

The present invention relates to an input buffer circuit and a logic circuit suitably built in superhigh-speed and high-integration LSI devices used in large scale computers and the like.

As the performance of large scale computers is enhanced, superhigh-speed logic LSI devices used are required to have an increased operating speed, increased density of circuit integration and decreased power consumption per unit circuit. In order to reduce power consumption of a circuit while retaining its fast operating property, lowering the supply voltage becomes a crucial technique.

FIG. 1 shows schematically a conventional input buffer circuit used in LSI devices as disclosed, for example, in Japanese Patent Application Laid-open No. 58-83434. In the figure, reference number 1 denotes an input terminal, 2 is an input protection circuit, and 3 is an output terminal. The circuit operates to receive the input signal with a differential transistor circuit made up of two transistors Q1' and Q2', and provide the in-phase output signal via a transistor Q3' in emitter-follower configuration. The differential transistor circuit is ridded of a threshold by having a feedback of the in-phase output signal to the inverting transistor Q2'.

Generally, fast-operating LSI devices employ ECL (Emitter Coupled Logic) levels as the input and output signal levels. Typical ECL levels range between −0.8 and −0.9 volt as a high level and between −1.6 and −1.8 volts as a low level. On this account, a voltage range approximately from −1.6 to '1.8 volts needs to be assured for a low level voltage. In the circuit arrangement of FIG. 1, if the voltage drop across current source resistor R3' in the differential transistor circuit is made smaller, the variation in the output voltage at the output terminal 3 increases relative to the variation in the input voltage or the supply voltage $V_{EE}'$, resulting in a reduction in a marginal operating condition. Therefore, when the circuit of FIG. 1 is designed to receive ECL-level signals, the supply voltage $V_{EE}'$, cannot be made smaller than −3 volts on assumption that the variation of $V_{EE}'$, is around ±10%. Accordingly, it is limited to reduce the power consumption of a circuit by decreasing the supply voltage.

FIG. 2 shows another conventional circuit arrangement disclosed in U.S. Pat. No. 3,795,822. In the figure, reference numbers 100 and 101 denote input terminals and 200 and 201 denote output terminals. The arrangement includes an input multiemitter transistor Q2", an output multiemitter transistor Q3", a clamping transistor Q9" terminating resistors R100 and R101, and a load resistor R102 for the input transistor Q2". The circuit operates under a negative supply voltage $V_{EE}''$. The above circuit arrangement is used primarily as a logic gate circuit, but its basic configuration is also capable of use as an input buffer circuit for LSI devices. The circuit receives input signals directly at multiple emitters of the input transistor Q2", and can operate under a smaller supply voltage condition $V_{EE}''$ than the conventional case shown in FIG. 1 by the amount equal to the base-to-emitter voltage $V_{BE}$ of the input transistor Q1'. A low output level at the output terminal 200 or 201 varies in response to the variation in the negative supply voltage $V_{EE}''$, and the output variation is equal to the supply voltage variation multiplied by the ratio of a voltage drop across the terminating resistor R100 (R101) to a voltage drop across the load resistor R102. Accordingly, decreasing the negative supply voltage $V_{EE}''$ causes a falling voltage drop across the terminating resistor R100 (R101), which results in an increased output variation and, thus, in narrower marginal operating condition of the circuit.

Suppose that the circuit of FIG. 2 receives an ECL-level signal, i.e., the circuit is designed to produce a signal amplitude of about 500 mV at the output terminal 200 (201) under a supply voltage variation of ±10%. For the negative supply voltage $V_{EE}''$ having a center value of −2.5 volts, the variation in a low output at the output terminal 200 (201) will be approximately ±150 mV. Actually, the input signal applied to the input terminal 100 (101) also varies, and therefore the negative supply voltage $V_{EE}''$ for the input buffer circuit of this arrangement will have a practical upper limit lower than −2.5 volts. The smaller the absolute value of the negative supply voltage, the more reduction in the power consumption of the circuit is possible. However, because of its adverse effect on the low output level variation, reduction in the absolute value of the negative supply voltage is limited.

SUMMARY OF THE INVENTION

The present invention contemplates to overcome the foregoing prior art deficiencies, and its prime object is to provide an input buffer circuit and a logic circuit capable of operating under a smaller supply voltage and alleviating the variation in the output voltage level against the supply voltage variation.

Another object of this invention is to provide a low-power consumption logic circuit arrangement which can be used also as an input buffer circuit.

In order to achieve the above objectives, the inventive circuit arrangement features to include an input transistor with its emitter receiving the input signal, an output transistor in emitter-follower configuration receiving the signal from the collector of the input transistor, voltage dividing resistors connected to the collector of the input transistor, and a feedback circuit for conducting the signal produced by the voltage dividing resistors back to the base of the input transistor, so that the output voltage is produced at the emitter of the output transistor. Using a multi-emitter input transistor, this circuit arrangement can be used as a (logical) AND gate for the input signals applied to the multiple emitters of the input transistor, or combining more than one above-mentioned circuit arrangement with their output terminals connected together, a (logical) wired-OR gate circuit can be configured.

DESCRIPTION OF THE PREFERRED EMBODIMENTS

The first embodiment of this invention will now be described with reference to FIG. 3. This circuit arrangement functions to level-shift the input signal, and it can be used as an input buffer circuit. The circuit arrangement can also function as a logic gate as will be described later.

Figure 3:
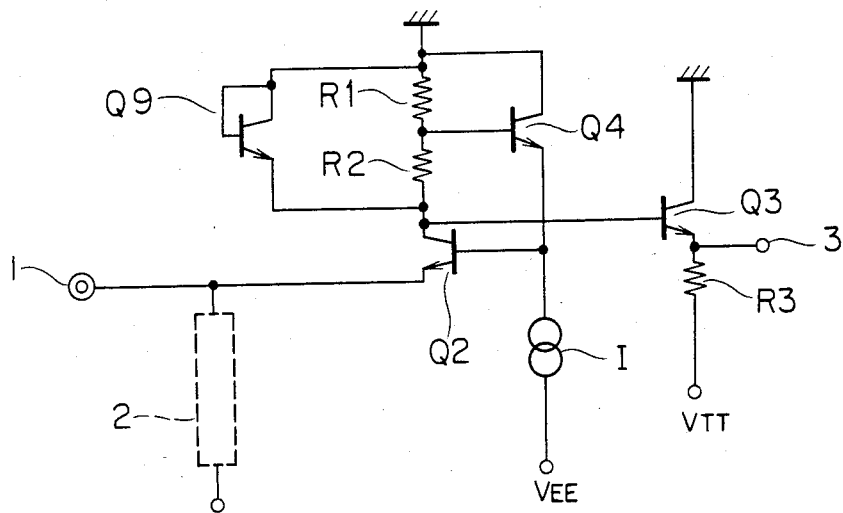
FIG. 3 is a schematic diagram showing an embodiment of this invention.

In FIG. 3, reference number 1 denotes an input terminal, 2 is an input protection circuit, and 3 is an output terminal. The input protection circuit 2 does not principally affect the small power voltage operation of the circuit, and its presence will be neglected in the following discussion.

The input signal at the input terminal 1 is directly applied to the emitter of an input transistor Q2, with its collector connected through voltage dividing resistors R1 and R2 to a voltage source (zero volt, i.e., grounded in this embodiment). The collector of Q2 is also connected to the base of a transistor Q3 in emitter-follower configuration with its collector grounded and with its emitter connected by a resistor R3 to a voltage source $V_{TT}$. The output signal of the circuit is produced at the emitter of the transistor Q3. Another transistor Q9 with its base and collector connected together to the ground is connected in parallel to the voltage dividing resistors R1 and R2 for the purpose of clamping the low level of the output signal. By the provision of the clamping transistor, the variation in the base voltage level of Q3 can be limited in a certain range, whereby a fall in the low output voltage level can be alleviated.

The base of the input transistor Q2 receives a feedback signal from the collector of Q2, the effect of which will be described later in connection with FIG. 4. The feedback signal is produced at the node of the voltage dividing resistors R1 and R2, and deliverd to the base of Q2 through the emitter of a transistor Q4 with its base connected to the node of R1 and R2 and with its collector grounded. The arrangement further includes a current source I with its one end connected to the base of Q2 and the emitter of Q4 and with its another end connected to a negative voltage source $V_{EE}$. The current source I is necessary to operate Q4. In this embodiment, the current source I can be realized in any of the following devices:

(1) A transistor having its base supplied with a bias voltage, its emitter connected to the negative voltage source $V_{EE}$ through a resistor, and its collector connected to the emitter of Q4.

(2) A resistor connected between the emitter of Q4 and the negative voltage source $V_{EE}$.

For the operating conditions of receiving an ECL-level input signal and providing an output signal amplitude of about 500 mV, the base voltage level of the input transistor Q2 is expected to fall down to about −1.0 volt. In this case, the negative voltage source $V_{EE}$ can be made as small as −1.5 to −2.0 volts. The reason for the circuit operationability under such a small supply voltage is as follows.

Figure 1:
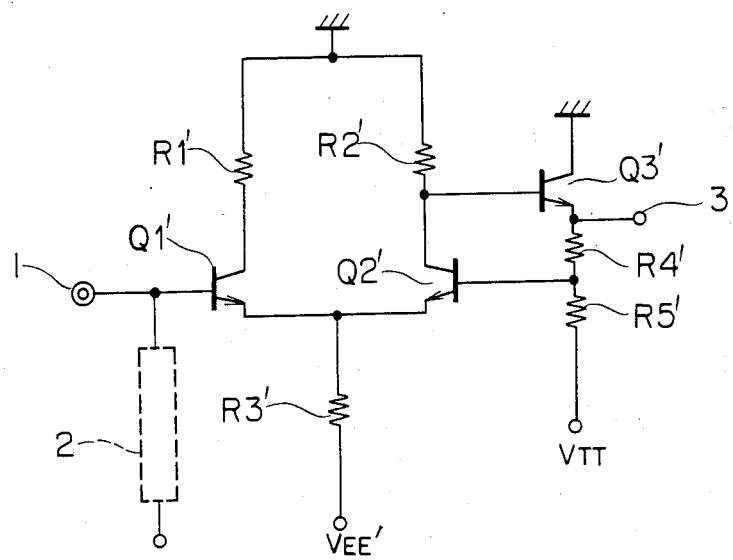
FIG. 1 is a schematic diagram showing the conventional input buffer circuit.
Figure 2:
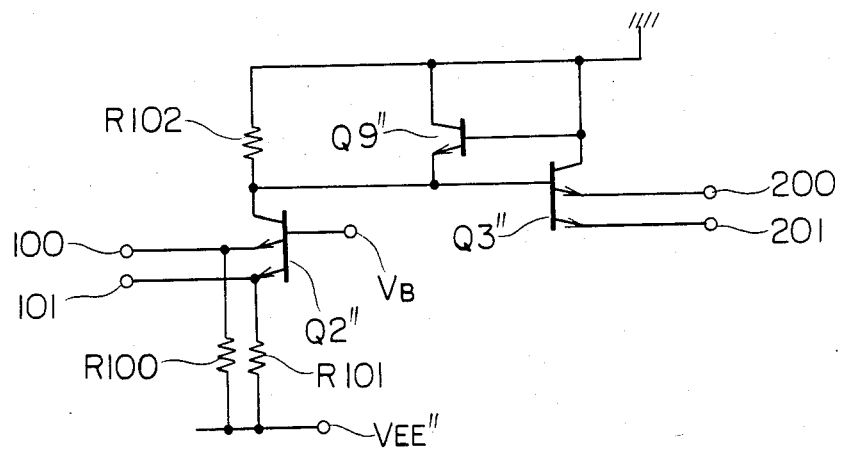
FIG. 2 is a schematic diagram showing another conventional circuit arrangement.

(1) The negative voltage source $V_{EE}$ is solely used for terminating the current source I as opposed to the arrangements of FIGS. 1 and 2. Accordingly, despite the input low-level voltage falling down to about −1.8 volts, it is not a factor of defining the upper limit of $V_{EE}$.

(2) Although the base of the input transistor Q2 falls down to about −1.0 volt, it is merely necessary for the normal circuit operation in this condition that the reference voltage for the input signal, i.e., the base voltage of Q2, does not vary significantly due to the variation of the negative voltage source $V_{EE}$. In the arrangement of this embodiment, a variation in $V_{EE}$ causes a variation in the current flowing through Q4, but in general a doubled emitter current can cause as small as 20 mV variation in the base-emitter voltage of the transistor Q4, and therefore the reference voltage does not vary significantly. For example, when a pure resistor current source I is used for a negative voltage source $V_{EE}$ of −1.5 volts, the resistor will create a voltage drop of about 500 mV. In this state, even if $V_{EE}$ varies ±10% (±150 mV), the current variation of the current source I will be around ±30% causing the base-emitter voltage of Q4 to vary as little as 5 to 10 mV. Accordingly, the base voltage of the input transistor Q2, i.e., the reference voltage, varies also as little as 5 to 10 mV.

From the above reason, the negative voltage source $V_{EE}$ can be lowered down to −1.5 to −2.0 volts in this embodiment, which conventionally has needed to be about −2.5 volts for the reception of ECL-level signals.

Figure 4:
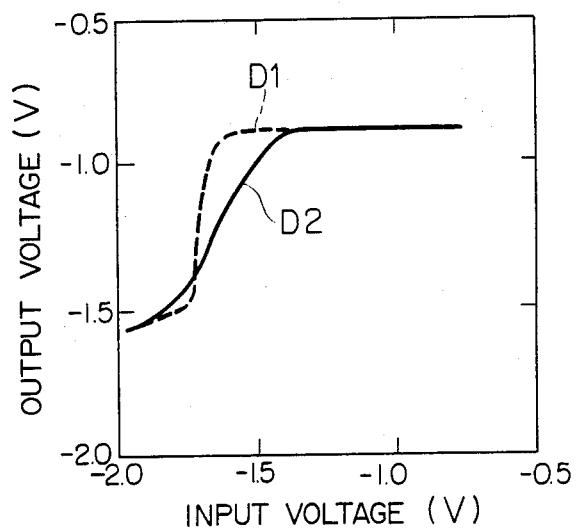
FIG. 4 is a graph showing d.c. signal transfer characteristics of a circuit shown in FIG. 3.

FIG. 4 is a graph of the d.c. signal transfer characteristics of the circuit in FIG. 3, showing the output voltage at the output terminal 3 on the ordinate plotted against the input voltage at the input terminal 1 on the abscissa. The solid curve D2 on the graph represents the characteristics of the embodiment shown in FIG. 3 with the setup of a high-level input voltage of −0.92 volt, a low-level input voltage of −1.73 volt, and an output signal amplitude of 500 mV. The dashed curve D1 on the graph represents the characteristics of the embodiment shown in FIG. 3, but in this case the feedback signal to the base of Q2 is replaced with a constant voltage (−1.0 volt) to produce the output signal amplitude of 500 mV. Both curves D1 and D2 do not fall below a −1.6 volts output voltage against the input voltage below −1.8 volts approximately because of the presence of the clamping transistor Q9. In the case of the characteristic curve D1, the output voltage goes up to −0.9 volt when the low-level input voltage varies to the allowable upper limit of −1.6 volts (low of ECL level). Whereas, the characteristic curve D2 for this embodiment shows less rise in the low-level output voltage within a specified variation range, whereby the noise margin can be enhanced as an effect of the output feedback of this embodiment. Namely, by a feedback of the output voltage to the reference voltage (base voltage of input transistor Q2), a d.c. gain of the circuit is lowered, which results in an increased noise margin of the circuit.

Figure 5:
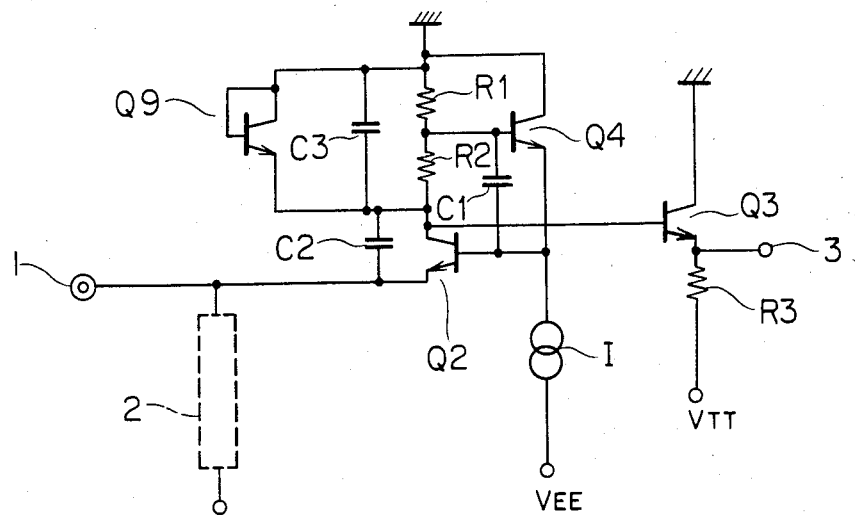
FIG. 5 is a schematic diagram showing another embodiment of this invention.

FIG. 5 shows another embodiment of this invention. This circuit arrangement basically the same as of FIG. 3, but is added by the first capacitor C1 connected between the base and emitter of the transistor Q4, the second capacitor C2 connected between the collector and emitter of the input transistor Q2, and the third capacitor Q3 connected across the voltage dividing resistor pair R1 and R2. The first capacitor C1 is used to lower the impedance of the feedback path to the base of the input transistor Q2, whereby the reference voltage point, i.e., the base of Q2, can have a sufficiently low impedance with respect to ground even if the current source I provides an extremely small current such as, for example, 50 μA. Lowering the impedance of the reference voltage point prevents the delay of the circuit from increasing, which would occur at a transition of the input pulse signal due to a switching noise added to the reference voltage point, resulting eventually in enhanced circuit performance. The capacitor C1 may be of around 0.5 pF for a fast operation with an input rise time of 1 ns, and it takes little space in the circuit layout. Accordingly, by putting the first capacitor C1 on the circuit, aggravation of response which would arise when the current source I provides an extremely small current such as around 50 μA can be prevented, and this is effective for reducing the power consumption of the circuit.

Figure 6:
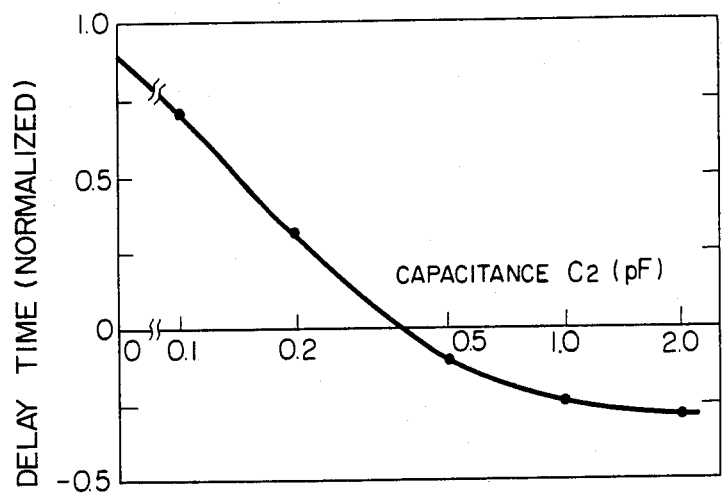
FIGS. 6 and 7 are graphs used to explain the characteristics of the arrangement shown in FIG. 5.

Next, the effect of the second capacitor C2 will be described. The second capacitor C2 connected between the emitter and collector of the input transistor Q2 functions to bypass transitionally a pulse signal from the input terminal 1 to the base of the emitter follower transistor Q3. Although the signal transfer speed would be enhanced by increasing the collector current of Q2, the a.c. coupling between the input terminal and the base of Q3 by C2 minimizes the delay time while the collector current of Q2 being left small. FIG. 6 is a plot showing the relationship between the signal transfer delay time and the capacitance of C2 for the case of the input transistor Q2 operating in a complete cutoff and a conductive state with a collector current of about 100 μA corresponding to a high input and a low input, respectively, at the input terminal 1. Since the transistor Q3 is driven by an extremely small current as low as 50 μA on the average, the circuit has a considerable delay in the absence of C2. However, as the capacitance of C2 is increased, the response (i.e. delay time) of the circuit is improved significantly without the need for increasing the collector current of Q2. A smaller collector current of Q2 enables not only a lower power consumption, but also a smaller input capacitance of the circuit, which is advantageous for the speedup of the circuit. Accordingly, the second capacitor C2 serves the circuit performance in both a smaller delay and a lower power consumption.

Figure 7:
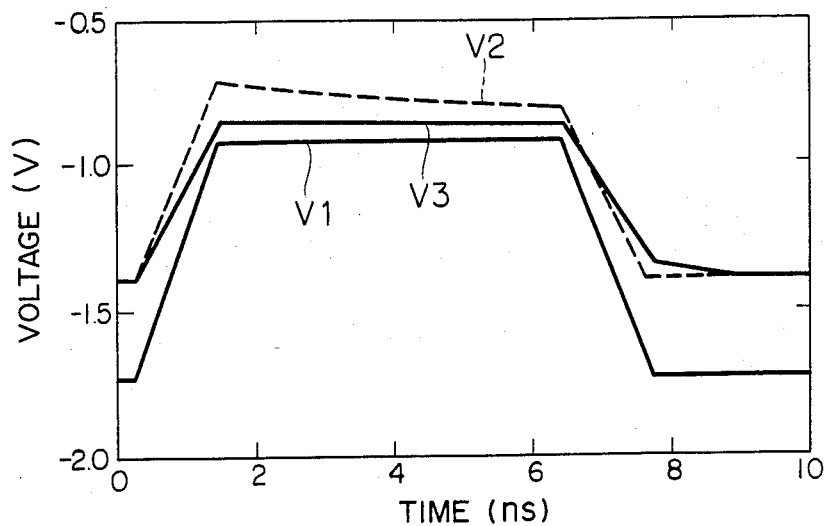

Next, the effect of the third capacitor C3 will be described. Generally, an LSI device operating at the ECL level receives a signal amplitude of about 900 mV at the input of the input buffer circuit. Whereas, the signal amplitude inside the device, i.e., at the output of the input buffer circuit, ranges 500 to 600 mV, and it is smaller than the external signal amplitude. When the input signal makes a transition from low to high, the output signal is apt to overshoot the steady state high level, and this phenomenon is particularly notable when the input signal is bypassed to the base of the output transistor Q3 through the second capacitor Q2 mentioned above. FIG. 7 shows this phenomenon, with V1 indicating the voltage waveform of the input signal and V2 indicating the output waveform at output terminal 3 in zero pF of the third capacitor C3. As can be seen in the diagram, an excessive high output does not settle down to the steady-state level in 5 ns. The reason for a longer output settling time is that the smaller Q2 current, i.e., about 50 μA on the average, needs large resistances for the voltage dividing resistors R1 and R2, e.g., 2 kΩ and 3 kΩ, respectively, and consequently a long time is taken for discharging excessively stored charges. Waveform V3 in FIG. 7 shows the output signal with the third capacitor of 0.3 pF connected across the voltage dividing resistor pair. In this case, C2 is made 1.0 pF for tolerance based on the result of FIG. 6. As can be seen from FIG. 7, connection of C3 prevents the output signal from overshooting the steady-state level when the input signal level is switched. The reason for the improved output signal waveform by the capacitor C3 is as follows.

(1) In order to produce an output signal amplitude (500 mV) smaller than the input signal amplitude (900 mV), the input signal is divided transitionally using two capacitors C2 and C3, and a voltage swing that matches the output signal amplitude is supplied to the base of the output transistor Q3.

(2) Even if voltage division by C2 and C3 does not take place as intended, resulting in a deviated output signal level from the steady-state level, the capacitor C3 connected across the voltage dividing resistors R1 and R2 operates on the emitter-follower Q3 to have a lowered base impedance, whereby excessive charges stored in the base can be discharged faster than the case without using C3.

If the output signal level settles to the steady-state level in a shorter time, the circuit can respond to input pulses with a switching interval of 2 to 3 ns without a significant delay increase. Accordingly, by connecting the third capacitor C3, the output signal level settles down to the steady-state in a shorter time thereby to minimize the signal transfer delay, and the circuit can operate normally for input pulses with a short switching interval.

In this embodiment, the capacitors C1, C2 and C3 can readily be realized in the form of reverse-biased pn-junction diodes or slightly forward-biased pn-junction diodes. The pn-junction diodes may be substituted by Schottky barrier diodes. Alternatively, the capacitors can be realized in extremely small areas through the formation of a material such as tantalum oxide ($Ta_2O_5$) having a high specific inductivity.

As can be seen from the foregoing description, the capacitors C1, C2 and C3 have independent effects, and therefore they need not always be put on the circuit together, but only necessary one(s) may be connected to meet each purpose.

Figure 8:
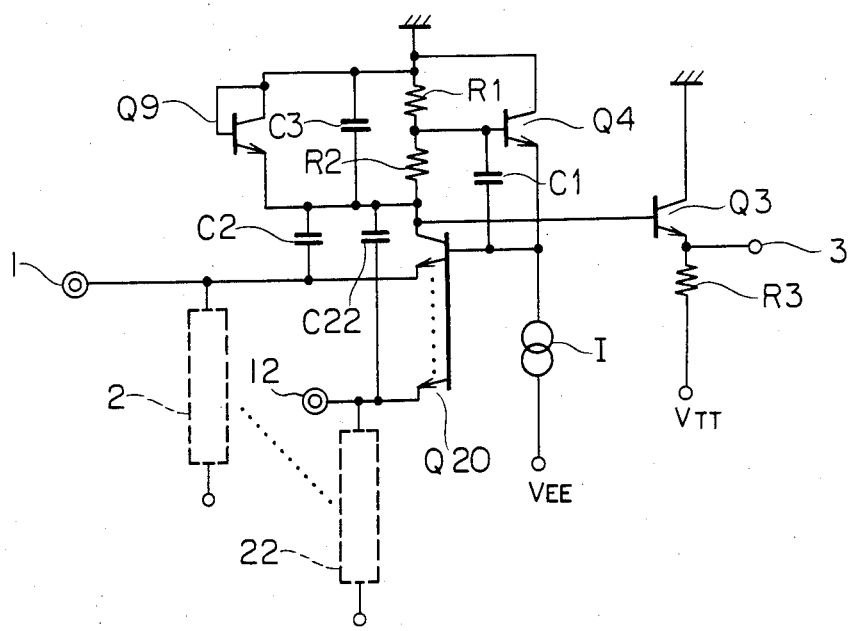
FIG. 8 is a schematic diagram showing still another embodiment of this invention.

FIG. 8 shows still another embodiment of this invention. The new circuit arrangement differs from that of FIG. 5 in that the input transistor Q2 is replaced with a multiemitter transistor Q20 and another input terminal 12, input protection circuit 22 and capacitor C22 are added. This circuit arrangement functions not only as an input buffer circuit, but as a (logical) AND gate providing an output for more than one input supplied independently to the input terminals. Obviously, the input protection circuits 2 and 22 are unnecessary when the circuit is used as a logical gate. Although the embodiment shown in FIG. 8 has only two input terminals 1 and 12, it can easily be expanded to receive more than two inputs along with the use of a multiemitter transistor Q20 having the same number of emitters. The input multiemitter transistor Q20 may obviously be substituted by a group of transistors with their bases and collectors each being joined commonly and with their emitters connected to individual input terminals.

Provision of the first capacitor C1 between the base and emitter of Q4 is effective to lower the impedance of the feedback path, provision of the second capacitor C2 (C20) between the emitter and collector of Q20 is effective to speed up of signal transfer, and provision of the third capacitor C3 across the voltage dividing resistors R1 and R2 is effective to minimize the settling time of the output signal level, as in the previous embodiment. Since these capacitors C1, C2 (C22) and C3 have independent effects, they need not always be put on the circuit together, but only necessary one(s) may be added to meet each purpose.

Figure 9:
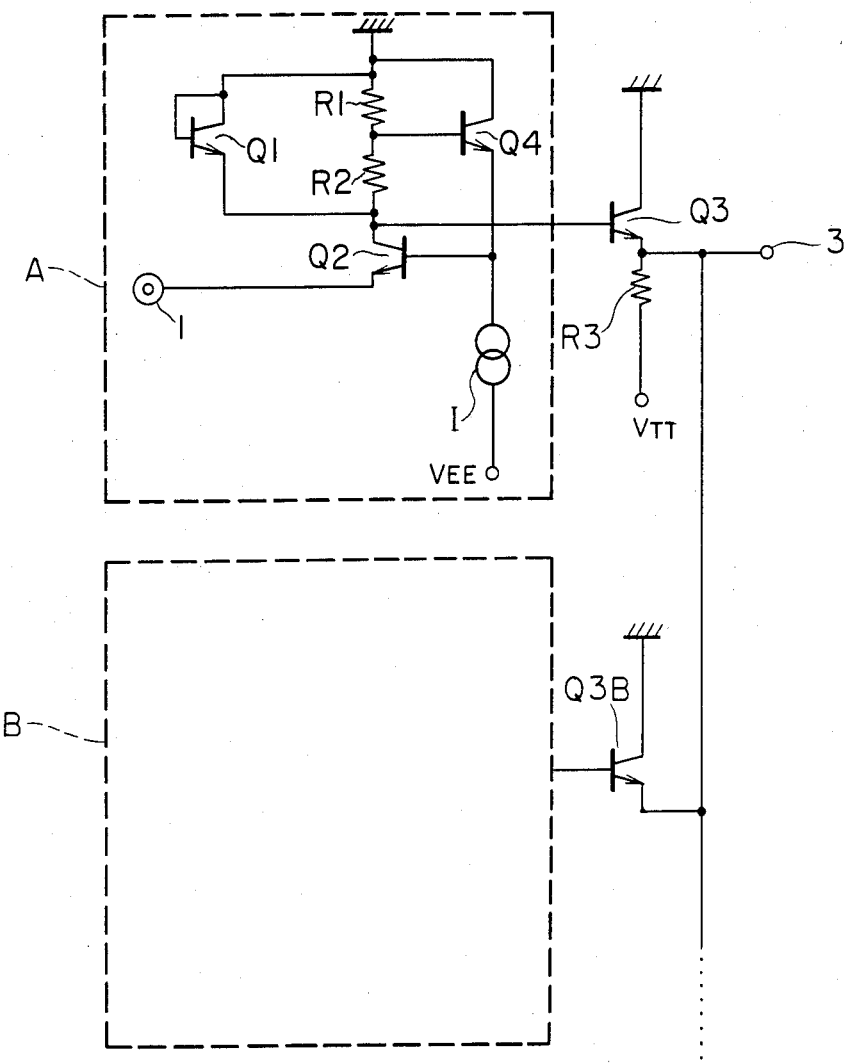
FIG. 9 is a schematic diagram used to explain the arrangement of the wired-OR gate circuit based on this invention.

The inventive circuit arrangement realizes a wired-OR logic by joining the emitter of the emitter-follower Q3 to the same portion of other circuit(s) as shown in FIG. 9. In the circuit arrangement of FIG. 9, section A is the circuit shown in FIG. 3 with the transistor Q3, resistor R3 and input protection circuit 2 being removed. The input protection circuit is neglected here as it does not relate to the logical function, but it may of course be provided.

The circuit section A may be arranged identically to the circuit shown in FIG. 5 or FIG. 8 excluding the output transistor Q3. Section B accompanied by an output emitter-follower Q3B represents another circuit comparable with section A, or both sections may be completely identical. Otherwise, the current switch of an ECL circuit may be used for section B. Although in FIG. 9 a wired-OR logic circuit made up of two input circuit sections is exemplified, the arrangement can readily be expanded to receive more than two inputs. Accordingly, by joining the output terminal 3 of the inventive circuit arrangement with the emitter-follower outputs of other circuits, any wired-OR logic circuit can be realized.

According to the present invention, as described above, the supply voltage of a circuit for receiving the ECL-level signal can be lowered from the conventional limit of −2.5 volts to about −1.5 to −2.0 volts, whereby power consumption of the circuit can be reduced. Moreover, the inventive circuit arrangement can be used as a (logical) AND gate or a wired-OR gate circuit, and also can be used as an input buffer circuit as well.

We claim:
1. An input buffer circuit comprising:
a input transistor receiving an input signal at its emitter electrode;
an emitter-follower transistor receiving a signal at its base electrode from a collector electrode of said input transistor and providing an output signal at an emitter electrode of said emitter-follower transistor;
voltage dividing resistors connected to a collector electrode of said input transistor and including a pair of resistors connected to each other in series for dividing a voltage of a signal at said collector electrode of said input transistor to produce a divided voltage signal; and
a feedback circuit coupled to receive said divided voltage signal produced by said voltage dividing resistors and including means for providing a feedback signal path to feed back the divided voltage signal to a base electrode of said input transistor,
said input buffer circuit further comprising at least one of a first capacitor connected in parallel to the feedback signal path of said feedback circuit, a second capacitor connected between the collector and emitter electrodes of said input transistor, and a third capacitor connected in parallel to said voltage dividing resistors.
2. An input buffer circuit according to claim 1, wherein said feedback circuit includes a transistor with its base electrode receiving a signal produced at a connection point of said voltage dividing resistors and with an emitter electrode connected to the base electrode of said input transistor; and a constant current source supplying a current to said transistor
3. An input buffer circuit according to claim 1 further comprising a clamping circuit connected in parallel to said voltage dividing resistors.
4. An input buffer circuit according to claim 3, wherein said clamping circuit comprises a transistor with its base and collector electrodes being connected together to one end of said voltage dividing resistors and with its emitter electrode being connected to another end of said dividing resistors.
5. An input buffer circuit according to claim 2, wherein said constant current source comprises a transistor with its base electrode being supplied with a bias voltage, with its emitter electrode being connected by a resistor to a negative voltage source, and with its collector electrode being connected to the base electrode of said input transistor.
6. An input buffer circuit according to claim 2, wherein said constant current source comprises a resistor connected between the base electrode of said input transistor and a negative voltage source.
7. A logic circuit comprising:
an input multiemitter transistor having a plurality of emitter electrodes at which input signals are received;
an emitter-follower transistor receiving a signal at its base electrode from a collector electrode of said input transistor and providing at its emitter electrode an output signal;
voltage dividing resistors connected to a collector electrode of said input transistor and including a pair of resistors connected to each other in series for dividing a voltage of a signal at said collector electrode of said input transistor to produce a divided voltage signal; and
a feedback circuit coupled to receive said divided voltage signal produced by said voltage dividing resistors and including means for providing a feedback signal path to feed back the divided voltage signal to a base electrode of said input transistor,
wherein said feedback circuit comprises as transistor with its base electrode receiving the divided voltage signal produced at a connection point node of said voltage dividing resistors and with its emitter electrode being connected to the base electrode of said input transistor; and a constant current source supplying a current to said transistor, and
wherein said logic circuit further comprises at least one of a first capacitor connected in parallel to the feedback signal path of said feedback circuit, a second capacitor connected between the collector and emitter electrodes of said input transistor, and a third capacitor connected in parallel to said voltage dividing resistors.
8. A logic circuit according to claim 7, wherein said input multiemitter transistor provides a logical AND function for input signals applied to said emitter electrodes of said input transistor.
9. A logic circuit according to claim 7 further comprising a clamping circuit connected in parallel to said voltage dividing resistors.
10. A logic circuit according to claim 9, wherein said clamping circuit comprises a transistor with its base and collector electrodes being connected together to one end of said voltage dividing resistors and with its emit- ter electrode being connected to another end of said resistors.

11. A logic circuit according to claim 7, wherein said constant current source comprises a transistor with its base electrode being supplied with a bias voltage, with its emitter electrode being connected by a resistor to a negative voltage source, and with its collector electrode being connected to the base electrode of said input transistor.

12. A logic circuit according to claim 7, wherein said constant current source comprises a resistor connected between the base electrode of said input transistor and a negative voltage source.

13. A logic circuit comprising:
   an input terminal;
   a first circuit including an input transistor receiving an input signal at its emitter connected to said input terminal, voltage dividing resistors connected to a collector of said input transistor and including a pair of resistors connected to each other in series for dividing a voltage of a signal at said collector electrode of said input transistor to produce a divided voltage signal and a feedback circuit coupled to receive the divided voltage signal produced by said voltage dividing resistors and including means for providing a feedback signal path to feedback the divided voltage signal to a base of said input transistor;
   a first emitter-follower transistor receiving an input signal at its base from a collector of said input transistor of said first circuit and providing an output signal at its emitter;
   a second circuit producing an output signal to be supplied to an emitter-follower transistor;
   a second emitter-follower transistor receiving said output signal of said second circuit at its base and providing an output signal at its emitter; and
   an output terminal in which the emitters of said first and second emitter-follower transistors are mutually connected,
   said logic circuit further comprising at least one of a first capacitor connected in parallel to the feedback signal path of said feedback circuit, a second capacitor connected between the collector and emitter electrodes of said input transistor, and a third capacitor connected in parallel to said voltage dividing resistors.

14. A logic circuit according to claim 13, wherein said second circuit further comprises an input transistor receiving an input signal at the emitter electrode thereof and providing a signal at the collector electrode thereof to said output transistor, a voltage dividing resistor pair connected to the collector electrode of said input transistor, and a feedback circuit conducting a signal produced by said voltage dividing resistor pair back to the base electrode of said input transistor.

* * * * *